(12) United States Patent
Jüstel et al.

(10) Patent No.: US 11,015,118 B2
(45) Date of Patent: *May 25, 2021

(54) PHOSPHOR CERAMIC

(71) Applicant: SEABOROUGH IP I B.V., Amsterdam (NL)

(72) Inventors: Thomas Jüstel, Witten (DE); Stephanie Möller, Steinfurt (DE); Florian Baur, Münster (DE); Nadja Kratz, Vallendar (DE); Jan Werner, Montabaur (DE); Murat Demirtas, Höhr-Grenzhausen (DE); Jürgen Honold, Amsterdam (NL); Tom Hilgerink, Amsterdam (NL)

(73) Assignee: Seaborough IP I B.V., Amsterdam (NL)

( * ) Notice: Subject to any disclaimer, the term of this patent is extended or adjusted under 35 U.S.C. 154(b) by 424 days.

This patent is subject to a terminal disclaimer.

(21) Appl. No.: 15/738,287

(22) PCT Filed: Jun. 24, 2016

(86) PCT No.: PCT/EP2016/064721
§ 371 (c)(1),
(2) Date: Dec. 20, 2017

(87) PCT Pub. No.: WO2016/207380
PCT Pub. Date: Dec. 29, 2016

(65) Prior Publication Data
US 2018/0171225 A1 Jun. 21, 2018

(30) Foreign Application Priority Data
Jun. 24, 2015 (DE) .................. 10 2015 110 189.0

(51) Int. Cl.
*C09K 11/77* (2006.01)
*C04B 35/16* (2006.01)
(Continued)

(52) U.S. Cl.
CPC .......... *C09K 11/7774* (2013.01); *C01F 17/30* (2020.01); *C04B 35/00* (2013.01);
(Continued)

(58) Field of Classification Search
CPC . C09K 11/7774; C09K 11/7794; C04B 35/00; C04B 35/01; C04B 35/44;
(Continued)

(56) References Cited

U.S. PATENT DOCUMENTS 9,045,691 B2 6/2015 Irie
10,131,839 B2 * 11/2018 Justel .................. H01L 33/60
(Continued)

FOREIGN PATENT DOCUMENTS

DE 10301169 A1 7/2003
DE 102006027133 A1 12/2007
(Continued)

OTHER PUBLICATIONS

Katelnikovas, A. et al.: "Synthesis and optical properties of $Li_3Ba_2La_3(MoO_4)_8:Eu^{3+}$ powders and ceramics for pcLEDs", Journal of Materials Chemistry, vol. 22, No. 41, Jan. 1, 2012 (Jan. 1, 2012), p. 22126, XP055309611, GB ISSN: 0959-9428, DOI: 10.1039/c2jm34123a figure 15, p. 22132.
(Continued)

*Primary Examiner* — C Melissa Koslow
(74) *Attorney, Agent, or Firm* — David P. Owen; Hoyng Rokh Monegier B.V.

(57) ABSTRACT

The present disclosure relates to a phosphor ceramic comprising a plurality of luminescence conversion materials,
(Continued)

wherein a luminescence conversion material serves as a matrix material for the others.

10 Claims, 11 Drawing Sheets

(51) Int. Cl.

| | | |
|---|---|---|
| *C04B 35/495* | (2006.01) | |
| *C04B 35/22* | (2006.01) | |
| *C04B 35/20* | (2006.01) | |
| *H01L 33/50* | (2010.01) | |
| *C04B 35/00* | (2006.01) | |
| *C04B 35/01* | (2006.01) | |
| *C01F 17/30* | (2020.01) | |
| *H05B 33/14* | (2006.01) | |
| *H05B 33/20* | (2006.01) | |

(52) U.S. Cl.
CPC .............. *C04B 35/01* (2013.01); *C04B 35/16* (2013.01); *C04B 35/20* (2013.01); *C04B 35/22* (2013.01); *C04B 35/495* (2013.01); *C09K 11/7794* (2013.01); *H01L 33/501* (2013.01); *H01L 33/504* (2013.01); *H01L 33/505* (2013.01); *H05B 33/145* (2013.01); *H05B 33/20* (2013.01); *C01P 2002/72* (2013.01); *C01P 2002/84* (2013.01); *C04B 2235/3201* (2013.01); *C04B 2235/3203* (2013.01); *C04B 2235/3205* (2013.01); *C04B 2235/3206* (2013.01); *C04B 2235/3208* (2013.01); *C04B 2235/3213* (2013.01); *C04B 2235/3215* (2013.01); *C04B 2235/3224* (2013.01); *C04B 2235/3225* (2013.01); *C04B 2235/3227* (2013.01); *C04B 2235/3244* (2013.01); *C04B 2235/3256* (2013.01); *C04B 2235/3258* (2013.01); *C04B 2235/3287* (2013.01); *C04B 2235/3427* (2013.01); *C04B 2235/604* (2013.01); *C04B 2235/6021* (2013.01); *C04B 2235/6022* (2013.01); *C04B 2235/6025* (2013.01); *C04B 2235/9646* (2013.01); *H01L 33/508* (2013.01)

(58) Field of Classification Search
CPC ..... C04B 35/495; C04B 35/16; H01L 33/501; H01L 33/503
See application file for complete search history.

(56) References Cited

U.S. PATENT DOCUMENTS

| | | |
|---|---|---|
| 2008/0093979 A1 | 4/2008 | Bechtel et al. |
| 2008/0191609 A1 | 8/2008 | Schmidt et al. |
| 2009/0189507 A1 | 7/2009 | Winkler et al. |
| 2010/0012964 A1* | 1/2010 | Copic ................. C04B 35/584 257/98 |
| 2010/0181585 A1* | 7/2010 | Juestel .................. C04B 35/44 257/98 |
| 2011/0181173 A1 | 7/2011 | De Graaf et al. |
| 2012/0181919 A1 | 7/2012 | Wei |
| 2015/0069299 A1 | 3/2015 | Pan et al. |
| 2015/0076406 A1 | 3/2015 | Zhou et al. |

FOREIGN PATENT DOCUMENTS

| | | |
|---|---|---|
| DE | 102013202119 A1 | 10/2013 |
| DE | 102012220656 A1 | 5/2014 |
| DE | 102013103763 A1 | 10/2014 |
| EP | 1588991 A1 | 10/2005 |
| WO | WO-2006072919 A2 | 7/2006 |

OTHER PUBLICATIONS

Ziegler, J. et al.: "Silica-Coated InP/Zns Nanosrystals as Converter Material in White LEDs", Advanced Materials, Wiley—V C H Verlag GMBH & Co., KGAA, DE, vol. 20, No. 21, Nov. 3, 2008 (Nov. 3, 2008), pp. 4068-4073, XP002637237, ISSN: 0935-9648, DOI: 10.1002/ADMA.200800724.

* cited by examiner

PHOSPHOR CERAMIC

CROSS-REFERENCE TO RELATED APPLICATIONS

This application is a National Stage of International Application No. PCT/EP2016/064721, filed on Jun. 24, 2016, and published in English as WO2016/207380 A1 on Dec. 29, 2016. This application claims the priority to German Patent Application Nos. 10 2015 110 187.4 and 10 2015 110 189.0, both filed on Jun. 24, 2015. The entire disclosures of the above applications are incorporated herein by reference.

FIELD

The present disclosure relates to the field of light emitting devices, more specifically to the field of light emitting devices in which ceramics are used.

BACKGROUND

This section provides background information related to the present disclosure which is not necessarily prior art.

Recently the use of ceramics for photon down-conversion in light emitting devices has found increased interest among experts, because they are typically stable even at higher temperatures, and in contrast to e.g. silicone materials there is no risk of browning due to aging at high temperatures and thus of deterioration. Moreover, ceramics have, compared to powder polymer composites, a higher thermal conductivity, so that the thus improved thermal management results in less thermal quenching.

As is generally the case for light emitting devices, also in the case of ceramic systems there is a constant need for further optimization and improvement. It is thus an object to provide an improved light emitting device and/or materials for such a device.

SUMMARY

This section provides a general summary of the disclosure, and is not a comprehensive disclosure of its full scope or all of its features.

This object is achieved by a light emitting device according to the present disclosure. Accordingly, a phosphor ceramic is provided which comprises at least two light emitting materials, wherein
  one of the materials has a melting point which is ≥200° C. lower than that of the other materials; and
  this material is used as a matrix material.

It has surprisingly been found that the properties of the light emitting device can be significantly improved in many applications. In particular, the device according to the disclosure provides one or more of the following advantages in most embodiments and specific implementations:
  simplified, cost-optimized production process, production at relatively low temperature
  an all-ceramic warm white (CCT<4000K) solution in a single panel
  adaptation of the end product with respect to the spectrum obtained (CRI, CCT, Color Point in CIE 1931, red proportion (R9))
  phosphors embedded in the matrix not sintered (the function of the embedded phosphors is not changed, such as efficiency or emission spectrum)
  adaptation of the ceramics to various production processes/variable processability using various shaping processes
  independent selection of the panel thickness
  adaptation of the panel thickness in order to optimize the excitation path regardless of the achieved light spectrum (especially in the presence of $Eu^{3+}$).

The term "phosphor" according to the present disclosure refers to or encompasses in particular a material which upon suitable excitation, preferably in the blue, violet, UV-A or UV-B range (i.e., in particular 280-490 nm), emits light, in particular within a wavelength range of 400-2500 nm (visible+infrared spectrum).

The term "phosphor ceramic" according to the present disclosure in particular refers to a ceramic which essentially consists of light emitting materials.

The term "essentially" according to the present disclosure refers to and/or encompasses a proportion of 95% (vol.-%/vol.-%), more preferably 98% (vol.-%/vol.-%), and most preferably 99 (vol.-%/vol.-%).

According to an alternative embodiment of the disclosure the phosphor ceramic comprises in particular and, thus, preferably the matrix material, also non-emitting material, preferably so that in one case doped and in the other case non-doped material is used. This has been proven advantageous in many embodiments of the disclosure, since in this way the proportion of dopant material may be restricted, or the doping level may be optimized. In some cases, it may be desirable to adjust the dopant level to achieve a certain weight-ratio between different materials, in order to optimize the ceramic process and properties.

The term "ceramic" according to the present disclosure refers to and/or encompasses in particular a compact crystalline or polycrystalline material which includes a controlled amount of pores or is non-porous.

The term "polycrystalline material" according to the present disclosure refers to and/or encompasses in particular a material having a bulk density of greater than 90 percent of the main component, consisting to more than 80 percent of individual crystal domains, wherein each crystal domain has a diameter of 0.1-20 µm and a different crystallographic orientation. The individual crystal domains may be bonded to each other or diluted via an amorphous or glassy material or by additional crystalline phases.

According to a preferred embodiment of the present disclosure the crystalline material has a density of ≥90% to ≤100% of the theoretical density. This has been found to be advantageous for many applications of the present disclosure.

The term "matrix material" according to the present disclosure refers to or encompasses in particular a material which is used as an embedding material or acts supportive to fix the embedded material/the embedded materials at their defined locations and/or an inorganic, ceramic/polycrystalline and light emitting material, in which one or more inorganic light emitting materials are embedded. The matrix material may—and this represents a preferred embodiment of the disclosure—be compressed by a thermal process such that a firm inclusion of the embedded light emitting materials is achieved.

According to the disclosure, the matrix material has a melting point which is ≥200° C. lower than that of the other light emitting materials. If more than one phosphor is present, this in particular means that the matrix material has a melting point which is ≥200° C. lower than that of the light emitting material with the next higher melting point.

According to a preferred embodiment of the disclosure, the matrix material has a melting point which is ≥400° C., more preferably ≥600° C. and most preferably ≥800° C. lower than that of the other light emitting materials.

According to a preferred embodiment of the present disclosure the matrix material is red-emitting. This has proven to be advantageous in most applications due to a number of reasons, on the one side because correspondingly low melting materials are available, and on the other side due to the energetic position of the emission (i.e. the fact that red radiation is least energy-rich).

According to a preferred embodiment of the present disclosure one of the light emitting materials, which is not the matrix material, is green-emitting or yellow-emitting. This has been found to be advantageous in most applications of the present disclosure.

According to a preferred embodiment of the present disclosure one of the light emitting materials, which is not the matrix material, is blue-emitting. This has been found to be advantageous in most applications of the present disclosure.

According to a preferred embodiment of the disclosure, the phosphor ceramic includes at least three light emitting materials, wherein preferably one of them is red-emitting, one is green-emitting and one is blue-emitting. However, the present disclosure is not limited thereto, alternatively, for example, further light emitting materials can be provided, which are either also red, green or blue-emitting or emit in other spectral ranges, such as (for example) yellow, NIR or UV.

According to an alternative preferred embodiment of the disclosure, the phosphor ceramic comprises a red-emitting matrix material and a green and/or yellow-emitting other material. This embodiment has been found to be particularly advantageous, when starting from a blue-emitting primary beam source (e.g. blue LED).

The term "red-emitting" according to the present disclosure in particular refers to and/or encompasses a material which upon suitable excitation has at least one emission band between 600 nm and 650 nm.

According to a preferred embodiment of the disclosure the red-emitting material comprises a material selected from the group consisting of
$ALn_{1-x-y}Eu_xM_2O_8:RE_y$,
$(Ln_{1-x-y}Eu_x)_2MO_6:RE_{2y}$,
$(Ln_{1-x-y}Eu_x)_2M_2O_9:RE_{2y}$,
$(Ln_{1-x-y}Eu_x)_2M_3O_{12}:RE_{2y}$,
$(Ln_{1-x-y}Eu_x)_2M_4O_{15}:RE_{2y}$,
$(Ln_{1-x-y}Eu_x)_6MO_{12}:RE_{6y}$,
$(AE_{1-2x-y}Eu_xA_{x+y})_3MO_6:RE_{3y}$,
$A_3AE_2(Ln_{1-x-y}Eu_x)_3(MO_4)_8:RE_y$,
or mixtures thereof,
wherein—for each structure independently—A is an alkali metal, i.e. selected from the group consisting of lithium, sodium, potassium, rubidium, cesium or mixtures thereof, AE is an alkaline earth metal, i.e. selected from the group consisting of beryllium, magnesium, calcium, strontium, barium or mixtures thereof, Ln is a rare earth metal selected from the group consisting of scandium, yttrium, lanthanum, gadolinium and lutetium or mixtures thereof, M is molybdenum, tungsten or mixtures thereof, RE is a rare earth metal selected from the group consisting of terbium, dysprosium, praseodymium, neodymium or mixtures thereof, wherein $0<x≤1$ and $0≤y≤0.05$.

According to a preferred embodiment of the disclosure, the red-emitting material comprises a material selected from the group comprising $Li_3Ba_2(Tb_{1-x-y}Eu_xLn_y)_3(Mo_{1-z}W_z)_8O_{32}$,
$A_3AE_2(Tb_{1-x-y}Eu_xLn_y)_3(Mo_{1-z}W_z)_8O_{32}$,
$A(Tb_{1-x-y}Eu_xLn_y)(Mo_{1-z}W_z)_2O_8$,
$(Tb_{1-x-y}Eu_xLn_y)_2(Mo_{1-z}W_z)O_6$,
$(Tb_{1-x-y}Eu_xLn_y)_2(Mo_{1-z}W_z)_2O_9$,
$(Tb_{1-x-y}Eu_xLn_y)_2(Mo_{1-z}W_z)_4O_{15}$,
$(Tb_{1-x-y}Eu_xLn_y)_2SiO_5$,
$(Tb_{1-x-y}Eu_xLn_y)_2Si_2O_7$,
$A(Tb_{1-x-y}Eu_xLn_y)SiO_4$,
$Ba_2(Tb_{1-x-y}Eu_xLn_y)_2Si_4O_{13}$,
$AE_2(Tb_{1-x-y}Eu_xLn_y)_2Si_4O_{13}$,
$Sr_3(Tb_{1-x-y}Eu_xLn_y)_2Si_6O_{18}$,
$AE_3(Tb_{1-x-y}Eu_xLn_y)_2Si_6O_{18}$,
$(Tb_{1-x-y}Eu_xLn_y)_2GeO_5$,
$(Tb_{1-x-y}Eu_xLn_y)_2Ge_2O_7$,
$A(Tb_{1-x-y}Eu_xLn_y)GeO_4$,
$Ba_2(Tb_{1-x-y}Eu_xLn_y)_2Ge_4O_{13}$,
$AE_2(Tb_{1-x-y}Eu_xLn_y)_2Ge_4O_{13}$,
$Sr_3(Tb_{1-x-y}Eu_xLn_y)_2Ge_6O_{18}$
$AE_3(Tb_{1-x-y}Eu_xLn_y)_2Ge_6O_{18}$
$(Tb_{1-x-y}Eu_xLn_y)_2(Ge_{1-a-b}Zr_aHf_b)O_5$,
$(Tb_{1-x-y}Eu_xLn_y)_2(Ge_{1-a-b}Zr_aHf_b)_2O_7$,
$A(Tb_{1-x-y}Eu_xLn_y)(Ge_{1-a-b}Zr_aHf_b)O_4$,
$Ba_2(Tb_{1-x-y}Eu_xLn_y)_2(Ge_{1-a-b}Zr_aHf_b)_4O_{13}$,
$Sr_3(Tb_{1-x-y}Eu_xLn_y)_2(Ge_{1-a-b}Zr_aHf_b)_6O_{18}$
$(Tb_{1-x-y}Eu_xLn_y)_2(Mo_{1-z}W_z)_3O_{12}$
with (for each material independently)
Ln=La, Gd, Lu, Y or mixtures thereof,
A=Li, Na, K, Rb, Cs or mixtures thereof, preferably Li,
AE=Sr, Ca, Br, or mixtures thereof, preferably Ba and/or Sr,
$x>0$ and $<1$ and $y≥0$ and $<1$, wherein $1-x-y>0$ and a, b≥0 and $<0.2$ and $z≥0$ and $≤1$,
or mixtures of these materials. Preferably, the material consists essentially thereof.

Particularly preferred materials are $Li_3Ba_2(Tb_{1-x-y}Eu_xLn_y)_3(Mo_{1-z}W_z)_8O_{32}$, $A(Tb_{1-x-y}Eu_xLn_y)(Mb_{1-z}W_z)_2O_8$, $(Tb_{1-x-y}Eu_xLn_y)_2(Mb_{1-z}W_z)O_6$, $(Tb_{1-x-y}Eu_xLn_y)_2(Mo_{1-z}W_z)_2O_9$, $(Tb_{1-x-y}Eu_xLn_y)_2(Mo_{1-z}W_z)_4O_{15}$, $(Tb_{1-x-y}Eu_xLn_y)_2(Mo_{1-z}W_z)_3O_{12}$ or mixtures thereof, wherein A, Ln, x and y are specified as described above. Preferably, the material consists essentially thereof.

According to a preferred embodiment of the present disclosure, the non-matrix material comprises a material with a garnet structure. This has been found advantageous for a couple of applications within the present disclosure. Preferably this material is distributed and/or dispersed in the matrix material.

The term "garnet structure" refers to and/or encompasses in particular a cubic material, in particular of the general structure $A_3B_2[XO_4]_3$ wherein A represents a divalent, B a trivalent, and X a tetravalent cation and/or of the general structure $A_3B_2[RO_4]_3$, wherein A, B, R are trivalent cations and wherein B and R may be identical, or mixtures of these structures.

According to the present disclosure the term "green-emitting" refers to and/or encompasses in particular a material which upon suitable excitation has at least emission between 500 nm and 550 nm. The following structures for the green-emitting material are particularly preferred: $BaMgAl_{10}O_{17}:Eu^{2+},Mn^{2+}$, $(Sr_{1-x}Ca_x)Si_2N_2O_2:Eu^{2+}$, $(Sr_{1-x}Ba_x)_2SiO_4:Eu^{2+}$, $(Sr_{1-x}Ba_x)_3SiO_5:Eu^{2+}$, $(Sr_{1-x}Ba_x)Ga_2S_4:Eu^{2+}$, $(Lu_{1-x}Y_x)_3(Al_{1-y}Ga_y)_5O_{12}:Ce^{3+}$, $(Lu_{1-x}Y_x)_3(Al_{1-y}Sc_y)_5O_{12}:Ce^{3+}$, $BaSi_2O_2N_2:Eu^{2+}$ or mixtures of these materials, wherein $0≤x≤1$ and $0≤y≤1$.

According to the present disclosure the term "blue-emitting" refers to and/or encompasses in particular a material which upon suitable excitation has at least emission between 420 and 500 nm. The following structures are particularly preferred: $(Ba_{1-x}Sr_x)MgAl_{10}O_{17}:Eu^{2+}$, $(Ba_{1-x}Sr_x)Mg_3Al_{14}O_{25}:Eu^{2+}$, $(Sr,Ca,Mg)_2Si_2O_6:Eu^{2+}$, $CaAl_2O_4:Eu^{2+}$, $(Ba_{1-x}Sr_x)Al_2Si_2O_8:Eu^{2+}$, $(Ba_{1-x}Sr_x)_6BP_5O_{20}:Eu^{2+}$, $(Y, Gd)(Nb_{1-x}Ta_x)O_4$, $(Ba,Sr,Ca)_2MgSi_2O_7:Eu^{2+}$, $(Ba_{1-x}Sr_x)ZrSi_3O_9:Eu^{2+}$, wherein $0 \leq x \leq 1$, $(Ca_{1-x-y}Sr_xBa_y)_5(PO_4)_3(F_{1-a}Cl_a):Eu^{2+}$, wherein $0 \leq y \leq 1$, and $0 \leq x \leq 1$ and $0 \leq a \leq 1$, or mixtures of these materials.

According to the present disclosure the term "yellow-emitting" refers to and/or encompasses in particular a material which upon suitable excitation has at least emission between 550 and 590 nm. The following structures are particularly preferred: $Ba_2Si_5N_8:Eu^{2+}$, $(Ca_{1-x}Sr_x)Si_2N_2O_2:Eu^{2+}$, $(Y_{1-x}Gdx)_3(Al_{1-y}Ga_y)_5O_{12}:Ce^{3+}$, $(Y_{1-x}Tb_x)_3(Al_{1-y}Ga_y)_5O_{12}:Ce^{3+}$, $SrLi_2SiO_4:Eu^{2+}$, $(Ca_{1-x}Sr_x)_2SiO_4:Eu^{2+}$, $(Ca_{1-x}Sr_x)_3SiO_5:Eu^{2+}$ or mixtures of these materials, wherein $0 \leq x \leq 1$ and $0 \leq y \leq 1$. It is understood that there is some overlap in materials designated green-emitting and yellow-emitting, as has been customary in the art.

According to a preferred embodiment of the present disclosure the matrix material has a melting point of $\leq 1300°$ C. This has proven to be advantageous, since in this way in most applications a good processability and manufacturability of the phosphor ceramic can be ensured. Preferably, the matrix material has a melting point of $\leq 1100°$ C., more preferably $\leq 1000°$ C., and most preferably $\leq 900°$ C.

According to a preferred embodiment of the present disclosure the volume fraction of the matrix material in the phosphor ceramic (in vol.-%/vol.-% in the finished phosphor ceramic) is between $\geq 20\%$ and $\leq 99\%$, preferably $\geq 40\%$ and $\leq 95\%$, and most preferably $\geq 60\%$ and $\leq 90\%$. This has been proven to be advantageous in many applications of the present disclosure.

Preferably, the "non-matrix" materials, each independently, have a particle size distribution D90 of $\leq 20$ µm. This has been proven to be advantageous for many applications.

Preferably, the "non-matrix" materials, each independently, have a particle size distribution D50 of 10 µm. Again, this has often proved to be advantageous.

Herein, the particle size distribution can be determined by stereological methods such as linear intercept methods with respect to images obtained by microscopy which show the structure of polished and etched samples.

According to a preferred embodiment of the disclosure the phosphor ceramic includes more than one light-emitting material, which is not a matrix material, and within the phosphor ceramic there is one or there are a plurality of zones or areas in which substantially only selected materials of these "non-matrix" light-emitting materials are present. These zones or areas according to a preferred embodiment of the disclosure can be realized by a random (i.e., uniform) concentration, or a concentration gradient within the phosphor ceramic or, alternatively, according to a preferred embodiment of the disclosure by bonding two phosphor ceramics of different composition by a thermal lamination process (thermal bonding).

Herein, these selected materials according to a preferred embodiment of the disclosure are materials which emit the same color, i.e. which are greenblue- and/or yellow-emitting.

This embodiment has proved to be advantageous because the color point of the phosphor ceramic in most applications can be changed simply afterwards, for example, by abrading zones or areas.

Herein the selective removal of material according to a preferred embodiment of the disclosure can be carried out by an ion beam preparation or laser process or according to an alternative embodiment of the disclosure by a mechanical machining or fine grinding process with use of a defined or undefined cutting edge.

According to a further preferred embodiment of the disclosure, moreover, a post-processing is performed by a grinding and polishing process. In this way in many applications of the present disclosure the surface quality can be increased and the reproducibility can be ensured.

Alternatively, the color point of the composite ceramic (i.e., the matrix material and at least one non-matrix material) may be controlled by careful weighing and mixing of the individual components in the ceramic synthesizing process, and measured by external excitation at the pump wavelength of interest. This color information can be used to match the composite ceramic to a preferred light emitting device, whose color can also be independently measured. In this way, the target color point (usually white) can be controlled with high accuracy, and the distribution of color points within a manufacturing process may be narrowed, which is desirable for end users and from a yield point of view.

According to a preferred embodiment of the disclosure, the phosphor ceramic comprises at least two light emitting materials, wherein one of the materials is used as a matrix material and comprises a material selected from the group comprising:

$ALn_{1-x-y}Eu_xM_2O_8:RE_y$,
$(Ln_{1-x-y}Eu_x)_2MO_6:RE_{2y}$,
$(Ln_{1-x-y}Eu_x)_2M_2O_9:RE_{2y}$,
$(Ln_{1-x-y}Eu_x)_2M_3O_{12}:RE_{2y}$,
$(Ln_{1-x-y}Eu_x)_2M_4O_{15}:RE_{2y}$,
$(Ln_{1-x-y}Eu_x)_6MO_{12}:RE_{6y}$,
$(AE_{1-2x-y}Eu_xA_{x+y})_3MO_6:RE_{3y}$,
$A_3AE_2(Ln_{1-x-y}Eu_x)_3(MO_4)_8:RE_y$, wherein—for each structure independently—A is an alkaline metal, i.e. selected from the group consisting of lithium, sodium, potassium, rubidium, cesium or mixtures thereof, AE is an alkaline earth metal, i.e. selected from the group consisting of beryllium, magnesium, calcium, strontium, barium or mixtures thereof, Ln is a rare earth metal selected from the group consisting of scandium, yttrium, lanthanum, gadolinium and lutetium or mixtures thereof, M is molybdenum, tungsten or mixtures thereof, RE is a rare earth metal selected from the group consisting of terbium, dysprosium, praseodymium, neodymium or mixtures thereof, wherein $0 < x \leq 1$ and $0 \leq y \leq 0.05$;

$Li_3Ba_2(Tb_{1-x-y}Eu_xLn_y)_3(Mo_{1-z}W_z)_8O_{32}$,
$A_3AE_2(Tb_{1-x-y}Eu_xLn_y)_3(Mo_{1-z}W_z)_8O_{32}$,
$A(Tb_{1-x-y}Eu_xLn_y)(Mo_{1-z}W_z)_2O_8$,
$(Tb_{1-x-y}Eu_xLn_y)_2(Mo_{1-z}W_z)O_6$,
$(Tb_{1-x-y}Eu_xLn_y)_2(Mo_{1-z}W_z)_2O_9$,
$(Tb_{1-x-y}Eu_xLn_y)_2(Mo_{1-z}W_z)_4O_{15}$,
$(Tb_{1-x-y}Eu_xLn_y)_2SiO_5$,
$(Tb_{1-x-y}Eu_xLn_y)_2Si_2O_7$,
$A(Tb_{1-x-y}Eu_xLn_y)SiO_4$,
$Ba_2(Tb_{1-x-y}Eu_xLn_y)_2Si_4O_{13}$,
$AE_2(Tb_{1-x-y}Eu_xLn_y)_2Si_4O_{13}$,
$Sr_3(Tb_{1-x-y}Eu_xLn_y)_2Si_6O_{18}$,
$AE_3(Tb_{1-x-y}Eu_xLn_y)_2Si_6O_{18}$,
$(Tb_{1-x-y}Eu_xLn_y)_2GeO_5$,
$(Tb_{1-x-y}Eu_xLn_y)_2Ge_2O_7$,
$A(Tb_{1-x-y}Eu_xLn_y)GeO_4$,
$Ba_2(Tb_{1-x-y}Eu_xLn_y)_2Ge_4O_{13}$,
$AE_2(Tb_{1-x-y}Eu_xLn_y)_2Ge_4O_{13}$,
$Sr_3(Tb_{1-x-y}Eu_xLn_y)_2Ge_6O_{18}$
$AE_3(Tb_{1-x-y}Eu_xLn_y)_2Ge_6O_{18}$
$(Tb_{1-x-y}Eu_xLn_y)_2(Ge_{1-a-b}Zr_aHf_b)O_5$, $(Tb_{1-x-y}Eu_xLn_y)_2(Ge_{1-a-b}Zr_aHf_b)_2O_7$,
$A(Tb_{1-x-y}Eu_xLn_y)(Ge_{1-a-b}Zr_aHf_b)O_4$,
$Ba_2(Tb_{1-x-y}Eu_xLn_y)_2(Ge_{1-a-b}Zr_aHf_b)_4O_{13}$,
$Sr_3(Tb_{1-x-y}Eu_xLn_y)_2(Ge_{1-a-b}Zr_aHf_b)_6O_{18}$
$(Tb_{1-x-y}Eu_xLn_y)_2(Mo_{1-z}W_z)_3O_{12}$
with (for each material independently)
Ln=La, Gd, Lu, Y or mixtures thereof,
A=Li, Na, K, Rb, Cs or mixtures thereof, preferably Li,
AE=Sr, Ca, Br, or mixtures thereof, preferably Ba and/or Sr,
x>0 and <1 and y≥0 and <1, wherein 1-x-y>0 and a, b≥0 and <0.2 and z≥0 and ≤1,
or mixtures thereof
and the at least one further material comprises a material having a garnet structure.

It has surprisingly been found that the properties of the light emitting device can significantly be improved in many applications, especially since for most of these applications it has surprisingly been found that these materials do not react or react only slightly with each other during the manufacturing process.

Preferably the material having a garnet structure is distributed and/or dispersed in the matrix material.

The present disclosure also relates to a method for manufacturing a phosphor ceramic according to the disclosure, comprising the steps of
a) providing starting materials comprising at least one light-emitting matrix material and at least one further light-emitting material in powder form;
b) optionally shaping, in particular by axial and/or cold isostatic pressing and/or tape casting or slot die processes and/or thermoplastic processes (injection molding, hot casting (low-pressure or medium-pressure injection molding), extruding);
c) sintering and/or hot pressing of the starting materials into a ceramic;
d) optionally recom pressing the sintered ceramic by hot isostatic pressing;
e) optionally reworking the sintered ceramic, in particular by an ion beam preparation process or by a mechanical machining or fine grinding process with use of a defined or undefined cutting edge.

This method has proved to be useful because in this way a suitable phosphor ceramic can be produced easily in most applications.

Preferably step b) is carried out such that the compression process takes place at pressures between 20 and 45 MPa.

Preferably step d) is carried out such that the recompression takes place at pressures between ≥120 and ≤180 MPa, preferably ≥140 and ≤160 MPa.

If an unequal distribution of "non-matrix" light-emitting materials is desired, the production of a corresponding phosphor ceramic can be done so that at first two precursor ceramics are prepared, in each of which only the matrix material and selected other light emitting materials are used. These can then, for example, be bonded to each other by thermal bonding, lamination and/or gluing.

The device according to the disclosure can be used in a variety of specific topological structures or applications, including—but not limited thereto—the following:
1. "Direct deposited phosphor ceramic":
The phosphor ceramic is applied directly as a thin plate onto an LED dice, sometimes using an intermediary bonding material, such as silicone, sol-gel, or glass.
2. "Remote phosphor" systems:
"Remote phosphor" systems in particular mean devices in which a phosphor (luminophore, engl.:phosphor) is arranged remote from a light-emitting light source emitting in a narrow wavelength range, usually embedded in or linked to a polymer, glass or ceramic matrix. Thus, a remote phosphor system is fundamentally different from a system in which the phosphor is applied directly onto or at the light source such as in LED light sources in which the phosphor is applied directly onto the light-emitting dice. Usually, a distinction is made between two basic structures, from which many variants can be derived:
a) "Remote phosphor in transmission application": The phosphor matrix is placed onto a reflection chamber in which the LED is disposed. The light can escape only through the phosphor matrix (transmission).
b) "Remote phosphor in remission application": The phosphor matrix is applied onto a reflective carrier or is coated with a reflective material on the back side, the LED light source is disposed in or slightly sideward from the emission direction and irradiates onto the phosphor matrix. The converted light is re-emitted in the direction of the light source or in the radiation direction, the light which has passed through the phosphor matrix light is directed by means of the back side reflective layer again through the phosphor matrix in the emission direction. Thus, the light can only escape in the remission direction.

According to a preferred embodiment of the present disclosure, within the inventive light emitting system, the ceramic phosphor may be optically coupled to an LED chip.

Such an LED chip may be one based on the III-V nitride material system. For example, the LED chip may comprise a GaInN based active region between n-type and p-type GaN layers which have been deposited on a suitable substrate (e.g., sapphire, silicon carbide, silicon, Ga2O3, or GaN itself) by known methods such as metal organic chemical vapor deposition (MOCVD) or molecular beam epitaxy (MBE). Optical coupling from the LED active region to the ceramic phosphor may be made via the substrate (in the case of a transparent substrate and a flip-chip mounting configuration) or the epitaxial layers (in the case of substrate-down mounting, or if the substrate has been removed as is the case for thin-film-flip-chip LED architectures). The ceramic phosphor may be physically attached to the LED chip, typically by a transparent adhesive such as a silicone adhesive.

Alternatively, the ceramic phosphor may be mounted remotely from the LED chip. Optical materials are optically provided to help direct and/or mix the primary light from the LED chip and that emitted by the ceramic phosphor. For example, optically reflective silicone material may be applied to surround the sides of the LED chip and ceramic phosphor, so that substantially all light emission is through the top surface of the ceramic phosphor. This has the benefit of increasing luminance as well as that of homogenizing color uniformity.

The LED chip may be mounted in a package, such as a ceramic package or lead-frame based package, to provide mechanical stability and/or handling capability, as well as thermal dissipation means. In addition, the package may provide a stage for the application of a lens which surrounds the LED chip including the ceramic phosphor. Such a lens may be made of transparent silicone and shaped in the form of a dome which assists with light-outcoupling from the ceramic phosphor.

Electrical current is supplied to the LED chip via electrodes within the package that are electrically connected to ohmic contact materials applied to n- and p-type layers within the LED chip. Portions of this current are converted to light generation within the LED active region. Depending on the detailed design of the LED active region, the primary light emission wavelength range may be tuned. For example, for GaInN, this range of tenability can be from the UV-A to throughout the visible spectrum. In particular, the primary emission wavelength may be selected to interact with the ceramic phosphor in a desirable way, for example, to provide a certain chromaticity of emitted light with certain color rendering characteristics.

One or more packaged LEDs as described above, which includes the LED chip and ceramic phosphor, may be used as part of a lighting system. Such a lighting system might be a lighting module, lamp, or luminaire. A lighting module might comprise a plurality of packaged LEDs and include additional means for light conditioning (optics) as well as thermal management (passive or active heatsinking means). Optionally, a module might further include electrical driving means for supplying target current and voltage levels to the LED(s) from a primary mains or battery power source. A lamp is usually formed in a standard housing form factor, and typically includes, in addition to the LED(s), electrical driving means to couple to mains power through a standard socket interface. Similarly, a luminaire has a housing and typically includes, in addition to the LED(s), electrical driving means to couple to mains power. In addition, sensing and/or communication electronics may be included into the lighting system.

A light emitting device and/or a ceramic phosphor according to the present disclosure may be of use in a broad variety of systems and/or applications, amongst them one or more of the following:

Office lighting systems
household application systems
shop lighting systems,
home lighting systems,
accent lighting systems,
spot lighting systems,
theater lighting systems,
fiber-optics application systems,
projection systems,
self-lit display systems,
pixelated display systems,
segmented display systems,
warning sign systems,
medical lighting application systems,
indicator sign systems, and
decorative lighting systems
portable systems
automotive applications
green house lighting systems The devices to be used according to the disclosure mentioned above and claimed and described in the exemplary embodiments are not subject to any particular exceptions with respect to their size, shape, material selection and technical conception, so that the selection criteria well-known in the field of application can be applied without restriction.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Further details, features and advantages of the subject matter of the disclosure can be obtained from the dependent claims and from the following description of the accompanying drawings, in which—by way of example—several embodiments of the device according to the disclosure are shown, as well as with respect to the following examples, which are to be considered as purely illustrative and not restrictive. In the drawings:

Corresponding reference numerals indicate corresponding parts throughout the several views of the drawings.

DETAILED DESCRIPTION

Example embodiments will now be described more fully with reference to the accompanying drawings.

Figure 1:
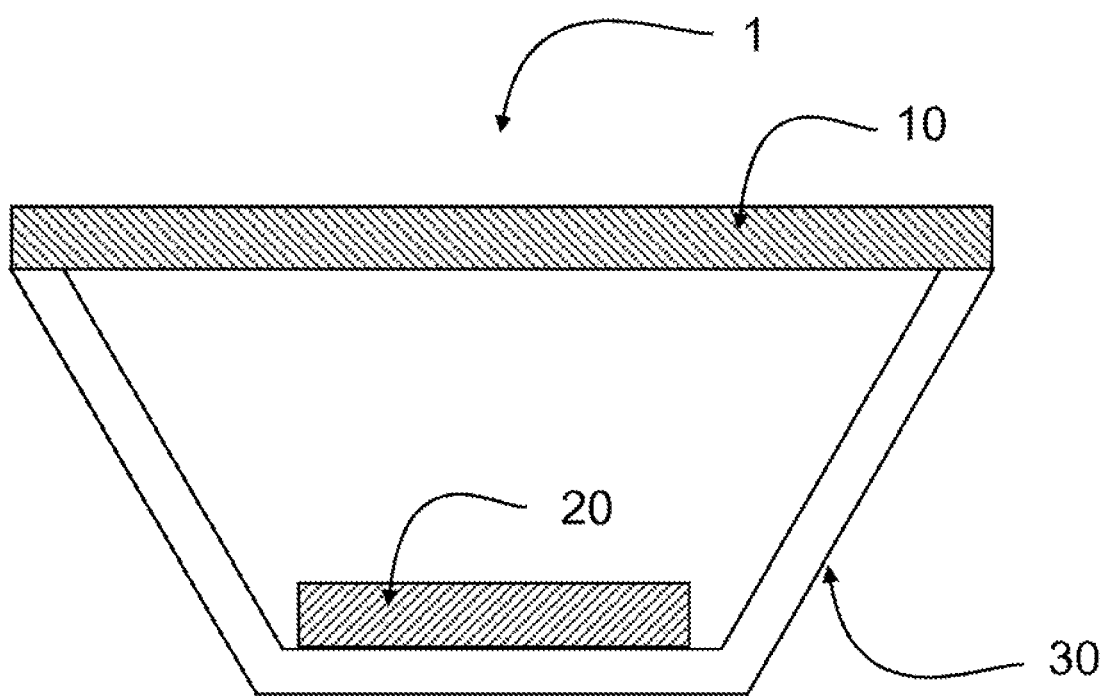
FIG. 1 shows a first embodiment of the light emitting device according to the disclosure

FIG. 1 shows a first embodiment of the light emitting device according to the disclosure in terms of a "remote phosphor" application. However, this is not restrictive and it is obvious to a person skilled in the art that also other embodiments are contemplated. According to FIG. 1 the device 1 comprises a UVA or blue emitting semiconductor device 20, which, for example, is a gallium-nitride based LED. Alternatively, the semiconductor device 20 may be a laser or may be based on other LED technologies realizing a higher radiation power per $mm^2$ by enabling a higher current flow.

The semiconductor device 20 is disposed in a reflective housing 30, above which the ceramic phosphor 10 is formed.

Figure 2:
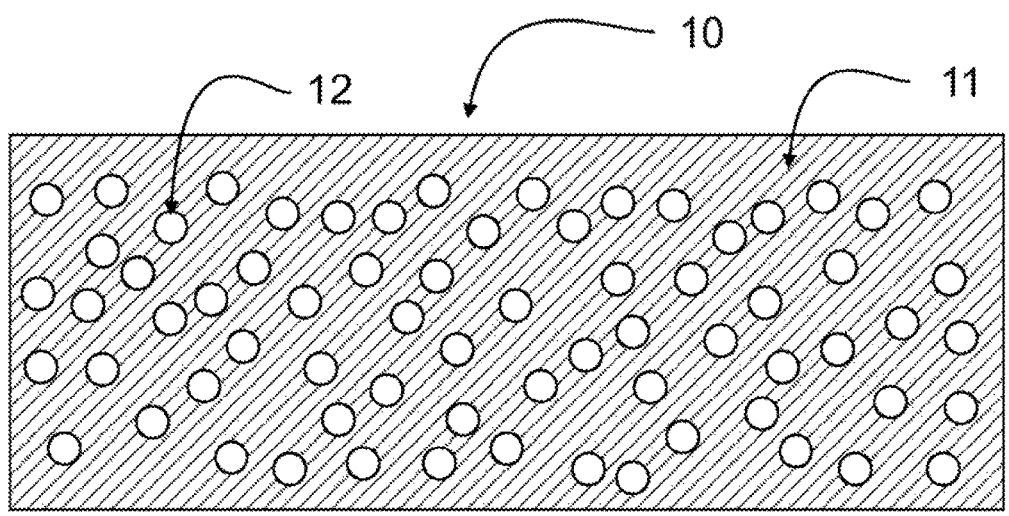
FIG. 2 shows a very schematic cross section through a first phosphor ceramic of a device according to the disclosure.

FIG. 2 shows a very schematic cross section through a first phosphor ceramic 10 of a device according to the disclosure. As can be seen in FIG. 1, the ceramic 10 comprises a matrix material 11 in which an additional light-emitting material 12 is dispersed in the form of small grains or particles.

Figure 3:
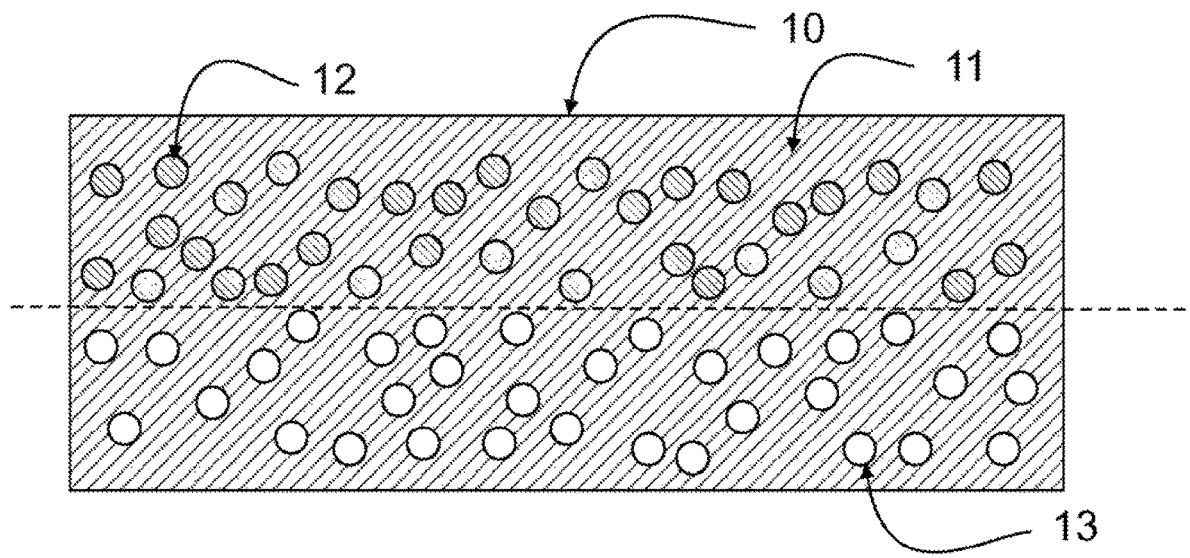
FIG. 3 shows a very schematic cross section through a second phosphor ceramic of a device according to the disclosure.

FIG. 3 shows an alternative light emitting ceramic, in which two zones are present, which are indicated by the dashed line. In the upper zone in the figure only a "non-matrix" light-emitting material 12 is disposed, in the lower zone a further material 13 is disposed. This phosphor ceramic is preferably produced such that at first two preceramics are prepared in which in one case only the material 12 and in the other case only the material 13 is processed together with the matrix material 11. Subsequently the two ceramics are bonded together and form the final phosphor ceramic.

Figure 4:
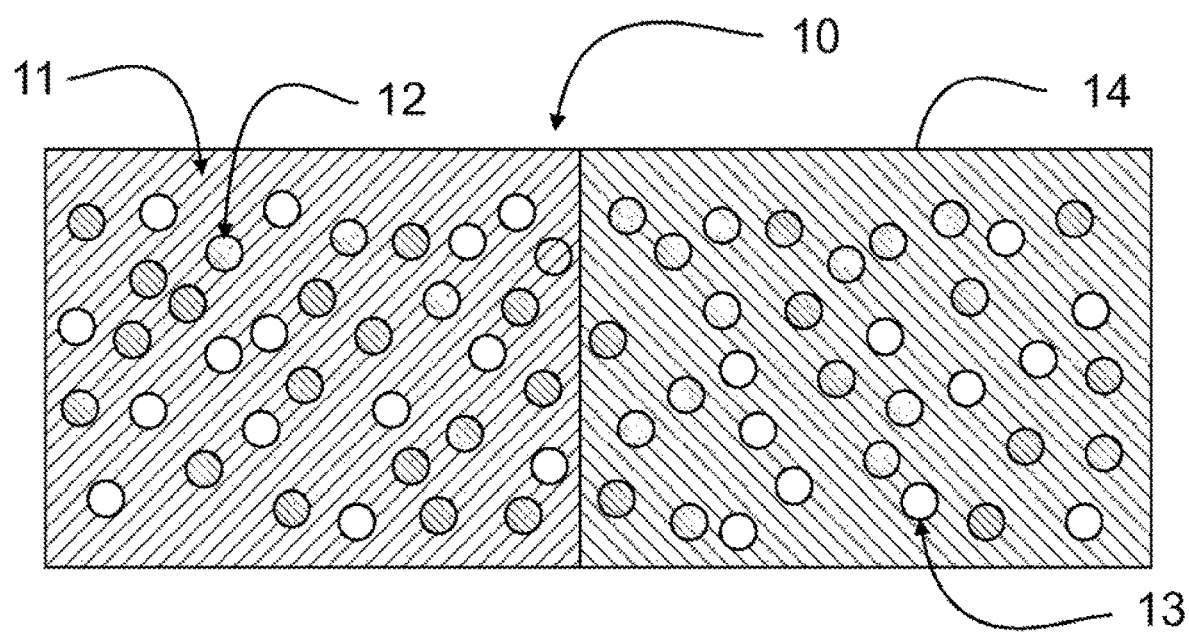
FIG. 4 shows a very schematic cross section through a third phosphor ceramic of a device according to the disclosure.

FIG. 4 shows a very schematic cross section through a third phosphor ceramic of a device according to the disclosure. As can be seen in FIG. 3, the ceramic 10 comprises a first matrix material 11 and non-emitting second matrix material 14, wherein in both two further light emitting materials 12 and 13 are dispersed in the form of smaller grains or particles. Herein, the materials 11 and 14 are preferably made of the same basic material, wherein the material 11 is doped and the material 14 is not doped.

This arrangement has the advantage that the emission of the matrix material can be confined specifically to a certain region within the phosphor ceramic and, moreover, doping material can be saved.

Hereinafter the disclosure is explained by way of examples, which are to be considered purely as illustrative and not as limiting.

EXAMPLE I

The ceramic according to Example I comprises 90 vol.-% $Li_3Ba_2La_{1.8}Eu_{1.2}(MoO_4)_8$ and 10 vol.-% $Lu_3Al_5O_{12}$:Ce (0.65%), and was prepared as follows:

Synthesis of $Li_3Ba_2La_{1.8}Eu_{1.2}(MoO_4)_8$ 0.7894 g (4.000 mmol) $BaCO_3$, 2.3030 g (16.000 mmol) $MoO_3$, 0.2217 g (3.000 mmol) $Li_2CO_3$, 0.4223 g (1.200 mmol) $Eu_2O_3$ and 0.5865 g (1.800 mmol) $La_2O_3$ were pounded in a mortar with acetone as grinding aid. The obtained powder was dried, transferred to a porcelain crucible and calcinated in air at 800° C. for 12 h. The cake thus obtained was ground and sieved through a 36-μm sieve. The melting point is approximately 960 degrees C.

Synthesis of $Lu_3Al_5O_{12}$:Ce (0.65%)

2.9651 g (7.451 mmol) $Lu_2O_3$, 0.0168 g (0.098 mmol) $CeO_2$ and 1.2745 g (12.500 mmol) $Al_2O_3$ were pounded in a mortar with acetone as grinding aid. The obtained powder was dried, transferred to a porcelain crucible and heated at 1750° C. for 12 h under a CO atmosphere. The melting point is approximately 2040-2080° C.

Manufacture of the ceramic

A mixture of 90 vol.-% $Li_3Ba_2La_{1.8}Eu_{1.2}(MoO_4)_8$ and 10 vol.-% $Lu_3Al_5O_{12}$:Ce (0.65%) was thoroughly ground in a mill. The crude phosphor powder thus obtained was mixed with an organic glycol binder, pressed into pellets and compacted by cold isostatic pressing at 300 MPa. The thus obtained ceramic green bodies were placed on a tungsten foil and heated at 1700° in the above described reducing atmosphere. After cooling to room temperature, the ceramics were sawed into wafers. The quantum yield is 67% and the color point is located at x=0.510 and y=0.458.

Figure 5:
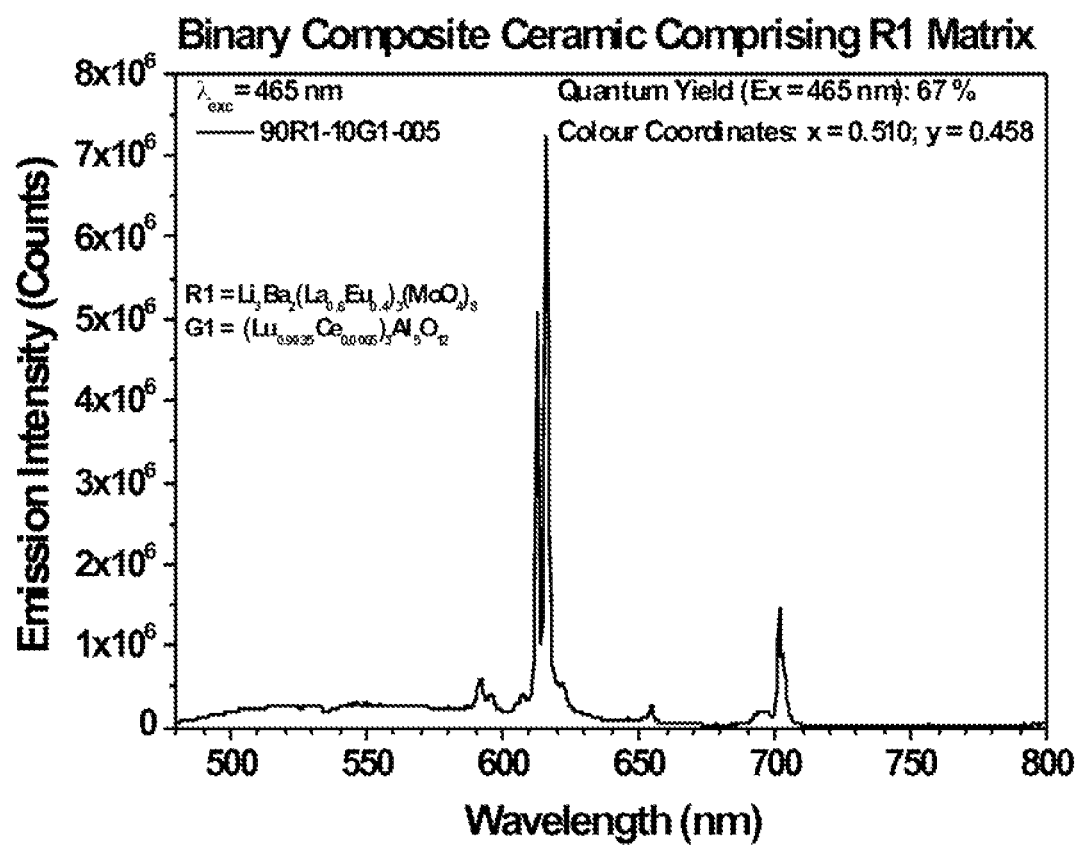
FIG. 5 shows an emission spectrum of the ceramic according to Example I.

FIG. 5 shows the emission spectrum of the ceramic at an excitation of 465 nm.

EXAMPLE II

The ceramic according to Example II comprises 85 vol.-% $Li_3Ba_2La_{1.8}Eu_{1.2}(MoO_4)_8$ and 15 vol.-% $Lu_3Al_5O_{12}$:Ce (0.65%). It was prepared analogously to the ceramic of Example I. The quantum yield is 68% and the color point is located at x=0.473 and y=0.488.

Figure 6:
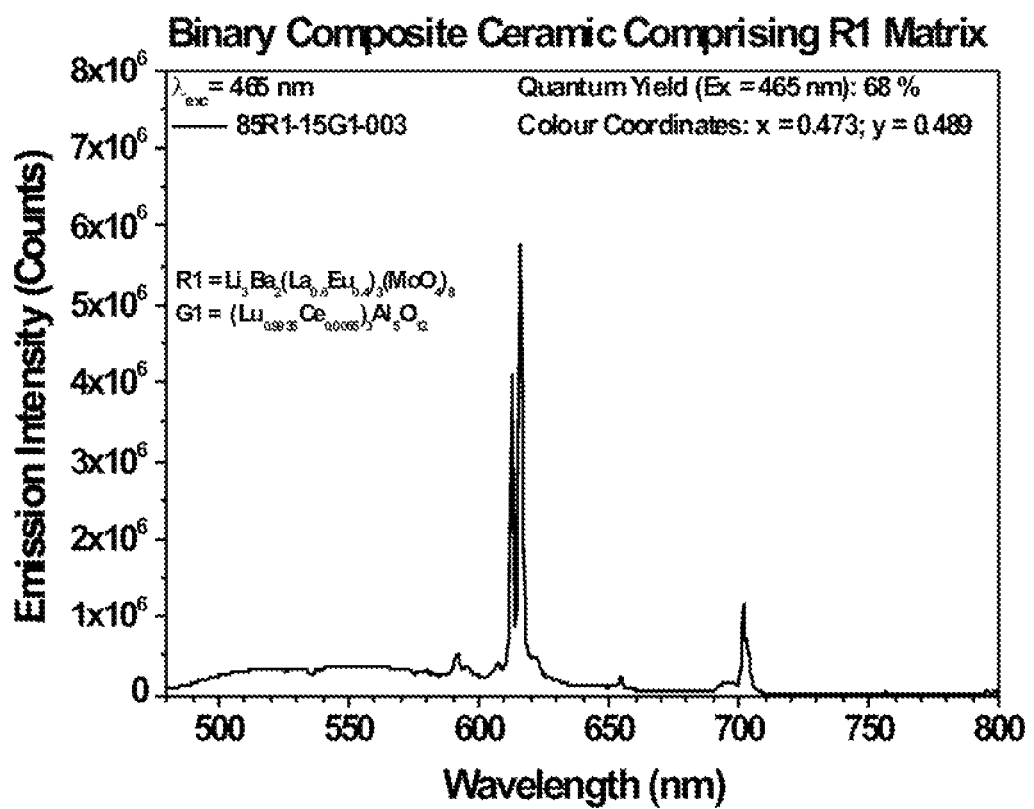
FIG. 6 shows an emission spectrum of the ceramic according to Example II.

FIG. 6 shows the emission spectrum of the ceramic at an excitation of 465 nm.

EXAMPLE III

The ceramic according to Example III comprises 80 vol.-% $Li_3Ba_2La_{1.8}Eu_{1.2}(MoO_4)_8$ and 20 vol.-% $Lu_3Al_5O_{12}$:Ce(0.65%). It was also prepared analogously to the ceramic of Example I. The quantum yield is 74% and the color point is located at x=0.455 and y=0.504.

Figure 7:
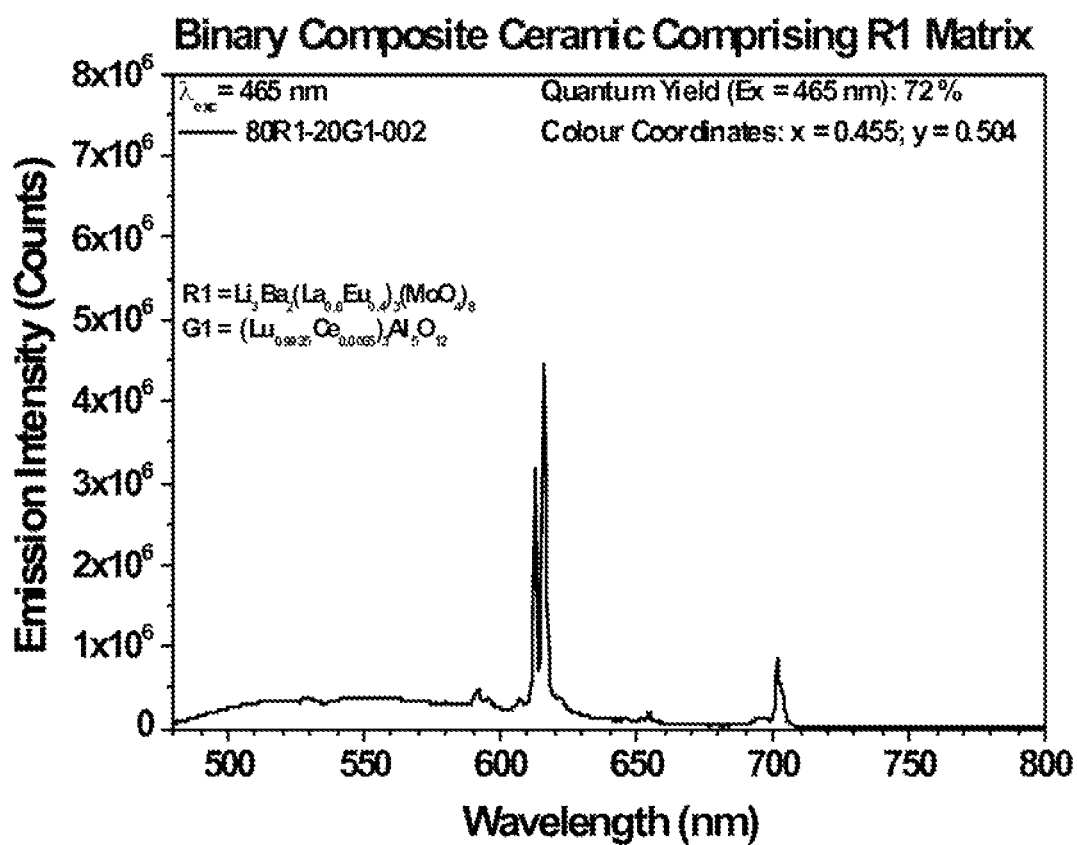
FIG. 7 shows an emission spectrum of the ceramic according to Example III.

FIG. 7 shows the emission spectrum of the ceramic at an excitation of 465 nm.

Figure 8:
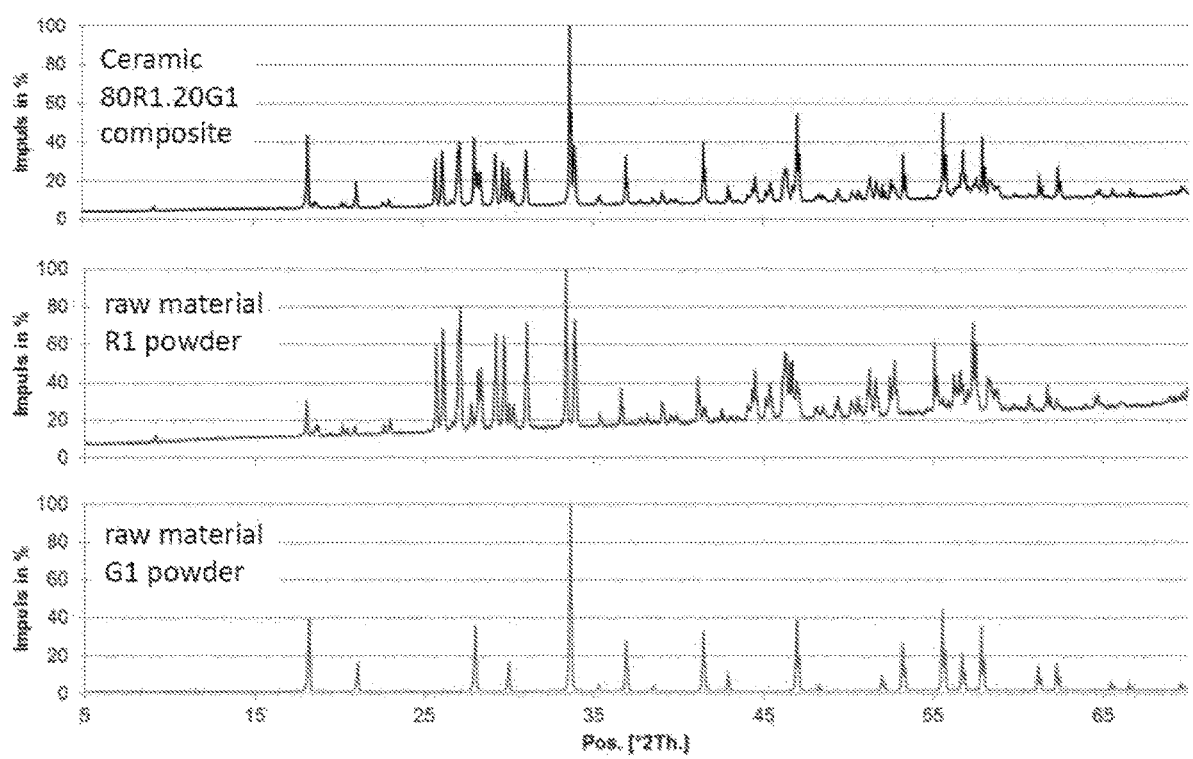
FIG. 8 shows a XRD spectrum of the ceramic of example III as well as of the two individual substances.

FIG. 8 shows (from top to bottom) the XRD spectra of the ceramic as well as the powder spectra of $Li_3Ba_2La_{1.8}Eu_{1.2}(MoO_4)_8$ and $Lu_3Al_5O_{12}$:Ce(0.65%). As is clearly seen, no further significant peaks appear in the ceramic spectrum, i.e. during the manufacture of the ceramic virtually no reaction has occurred between the two substances.

EXAMPLE IV

The ceramic according to Example IV comprises 90 vol.-% $Li_3Ba_2La_{1.8}Eu_{1.2}(MoO_4)_8$ and 10 vol.-% $Y_3Al_5O_{12}$:Ce(2.5%). It was also prepared analogously to the ceramic of Example I. The quantum efficiency is 42% and the color point is at x=0.500 and y=0.483, the melting point of $Y_3Al_5O_{12}$:Ce is about 1940-1980° C.

Figure 9:
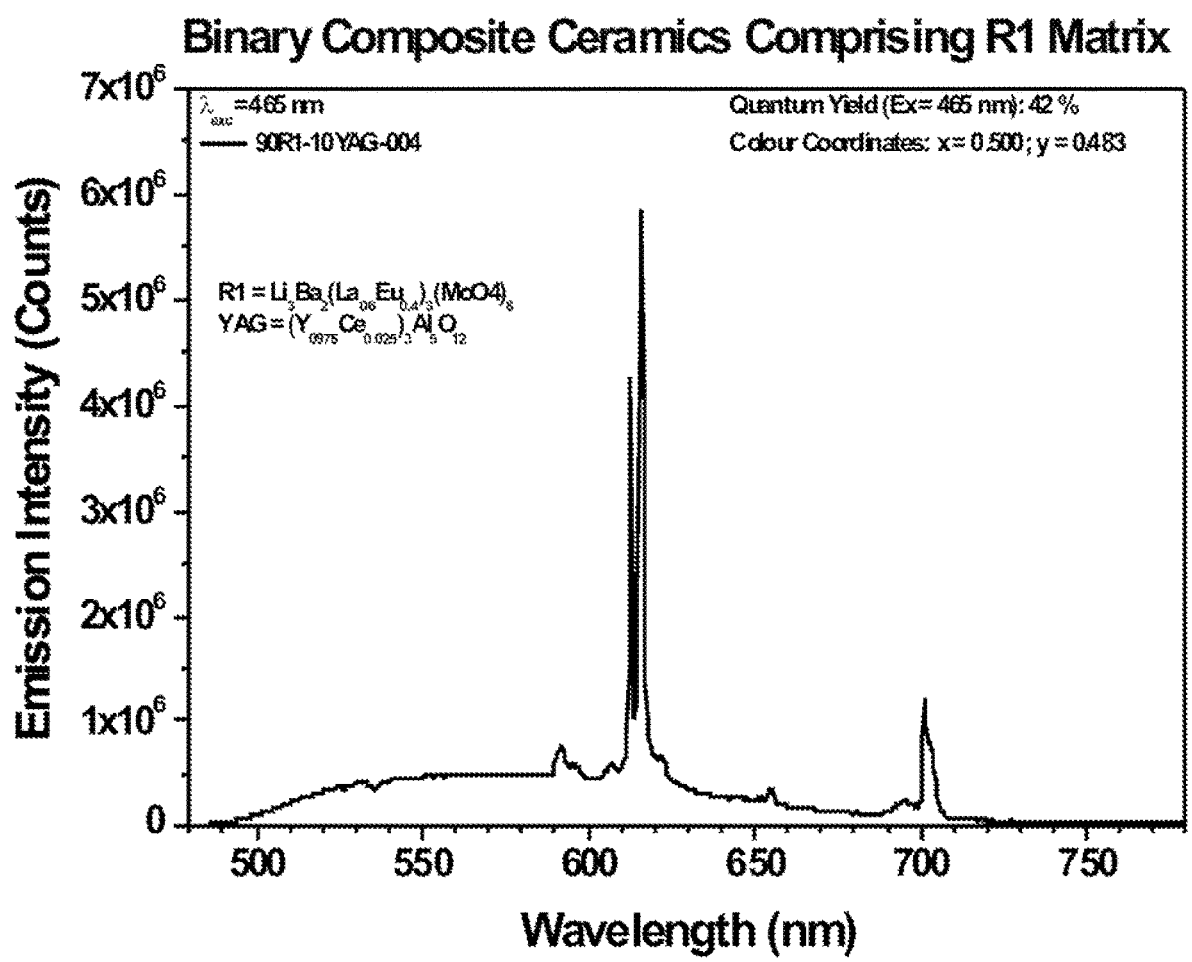
FIG. 9 shows an emission spectrum of the ceramic according to Example IV.

FIG. 9 shows the emission spectrum of the ceramic at an excitation of 465 nm.

EXAMPLE V

The ceramic according to Example V includes 85% $Li_3Ba_2La_{1.8}Eu_{1.2}(MoO_4)_8$ and 15% $Y_3Al_5O_{12}$:Ce(2.5%). It was also prepared analogously to the ceramic of Example I. The quantum yield is 51% and the color point is located at x=0.483 and y=0.500.

Figure 10:
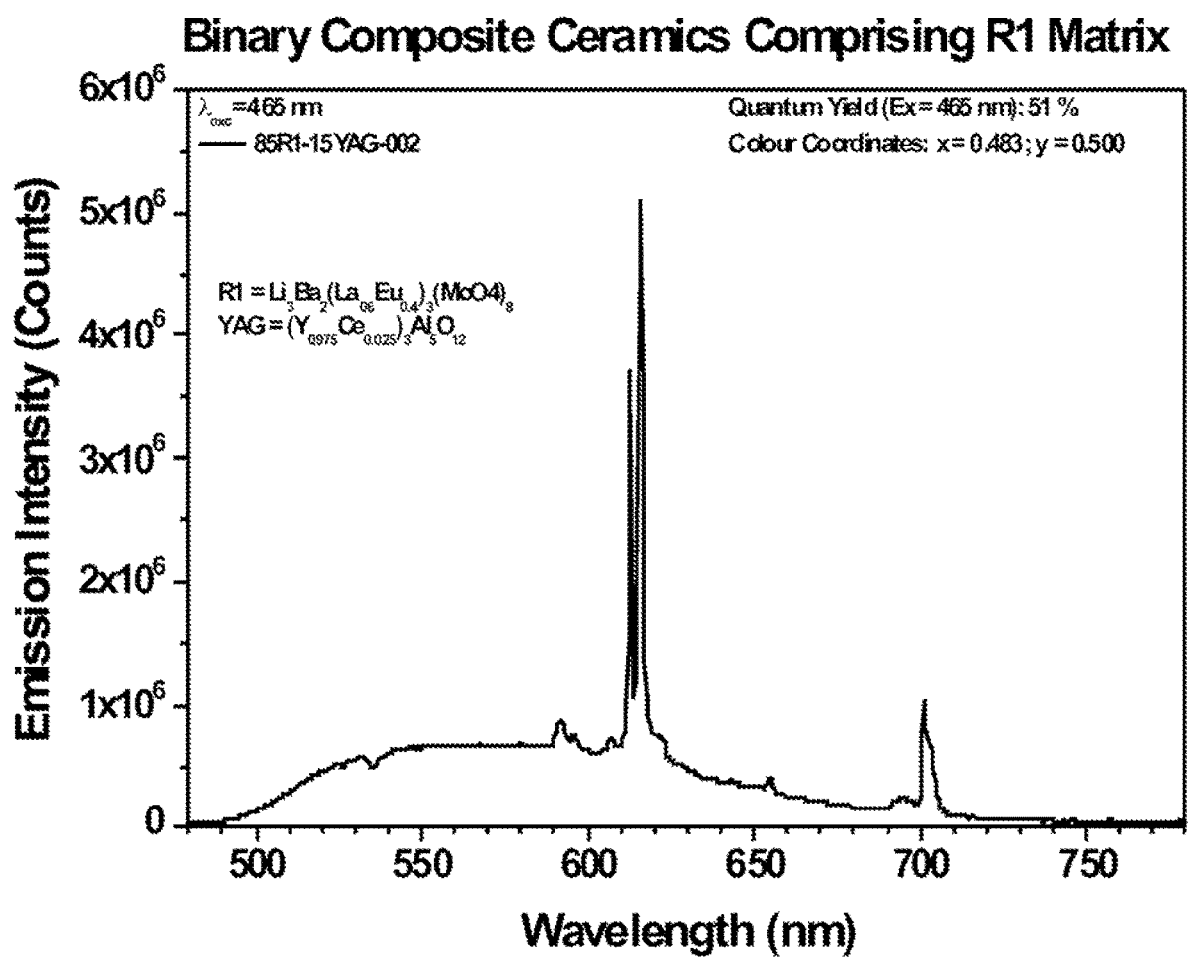
FIG. 10 shows an emission spectrum of the ceramic according to Example V.

FIG. 10 shows the emission spectrum of the ceramic at an excitation of 465 nm.

EXAMPLE VI

The ceramic according to Example VI comprises 80 vol.-% $Li_3Ba_2La_{1.8}Eu_{1.2}(MoO_4)_8$ and 20 vol.-% $Y_3Al_5O_{12}$:Ce(2.5%). It was also prepared analogously to the ceramic of Example I. The quantum yield is 69% and the color point is 0.477 and y=0.507.

Figure 11:
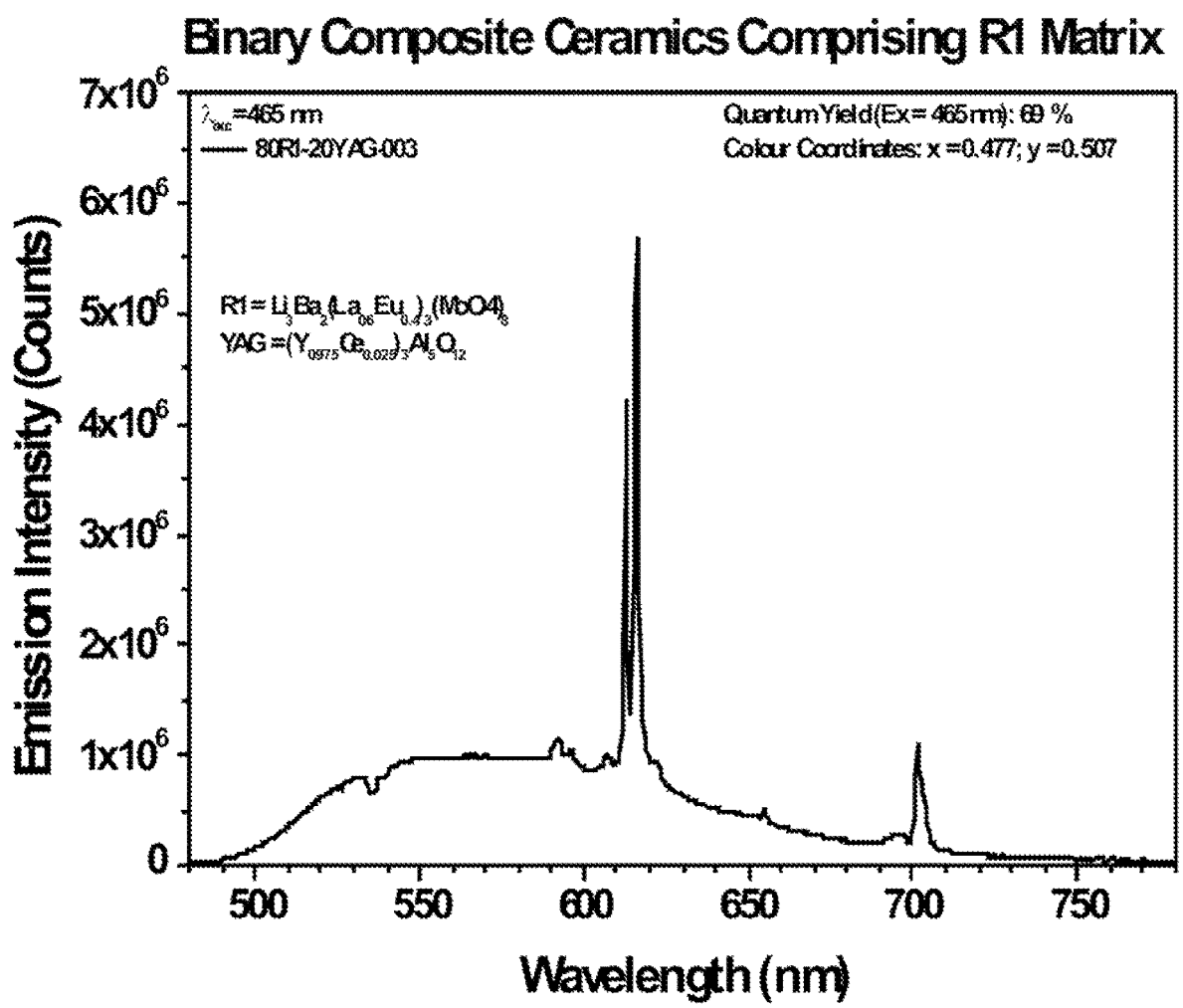
FIG. 11 shows an emission spectrum of the ceramic according to Example VI.

FIG. 11 shows the emission spectrum of the ceramic at an excitation of 465 nm.

Figure 12:
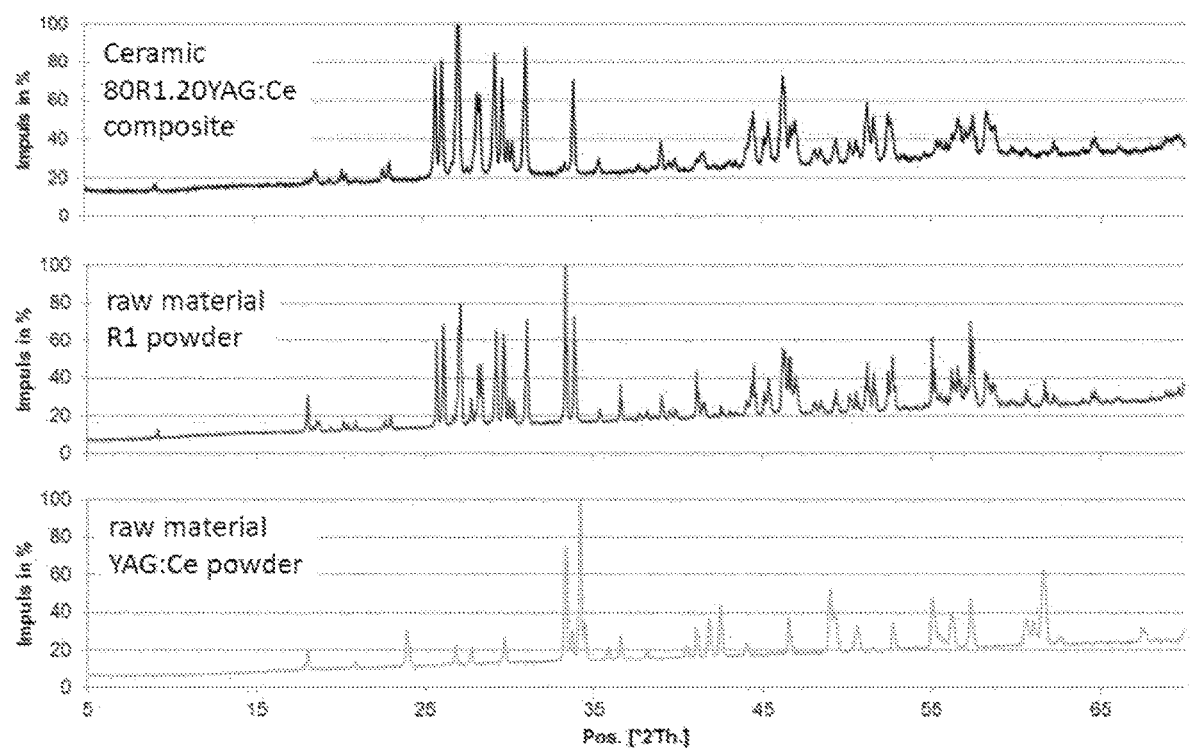
FIG. 12 shows a XRD spectrum of the ceramic of example VI as well as of the two individual substances.

FIG. 12 shows (from top to bottom) the XRD spectra of the ceramic and the powder spectra of $Li_3Ba_2La_{1.8}Eu_{1.2}(MoO_4)_8$ and $Y_3Al_5O_{12}$:Ce(2.5%). As is clearly seen, no further significant peaks appear in the ceramic spectrum, i.e. during the manufacture of the ceramic virtually no reaction has occurred between the two substances.

The individual combinations of the ingredients and the characteristics of the embodiments mentioned above are exemplary, the exchange and substitution of the teachings included in this publication with other teachings included in the cited documents are also explicitly contemplated. A person skilled in the art will recognize that variations and modifications of the embodiments described herein and other embodiments may be realized without departing from the spirit and scope of the disclosure. Accordingly, the above description is to be considered exemplary and not as limiting. The word "comprises" used in the claims does not exclude other elements or steps. The indefinite article "a" does not exclude the importance of a plural. The mere fact that certain measures are recited in mutually different claims does not indicate that a combination of these measures cannot be used to advantage. The scope of the disclosure is defined in the following claims and the associated equivalents.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are to be regarded as a departure from the disclosure, and all such modifications are intended to be included within the scope of the disclosure.

The invention claimed is:

1. A light emitting device, comprising a phosphor ceramic comprising at least two light emitting materials, wherein
one of the materials has a melting point which is ≥200° C. lower than that of the other light emitting materials, and this material is used as matrix material,
wherein the matrix material comprises one or more of the following materials:
$(Tb_{1-x-y}Eu_xLn_y)_2SiO_5$,
$(Tb_{1-x-y}Eu_xLn_y)_2Si_2O_7$,
$A(Tb_{1-x-y}Eu_xLn_y)SiO_4$,
$Ba_2(Tb_{1-x-y}Eu_xLn_y)_2Si_4O_{13}$,
$AE_2(Tb_{1-x-y}Eu_xLn_y)_2Si_4O_{13}$,
$Sr_3(Tb_{1-x-y}Eu_xLn_y)_2Si_6O_{18}$,
$AE_3(Tb_{1-x-y}Eu_xLn_y)_2Si_6O_{18}$,
$(Tb_{1-x-y}Eu_xLn_y)_2GeO_5$,
$(Tb_{1-x-y}Eu_xLn_y)_2Ge_2O_7$,
$A(Tb_{1-x-y}Eu_xLn_y)GeO_4$,
$Ba_2(Tb_{1-x-y}Eu_xLn_y)_2Ge_4O_{13}$,
$AE_2(Tb_{1-x-y}Eu_xLn_y)_2Ge_4O_{13}$,
$Sr_3(Tb_{1-x-y}Eu_xLn_y)_2Ge_6O_{18}$,
$AE_3(Tb_{1-x-y}Eu_xLn_y)_2Ge_6O_{18}$,
$(Tb_{1-x-y}Eu_xLn_y)_2(Ge_{1-a-b}Zr_aHf_b)O_5$,
$(Tb_{1-x-y}Eu_xLn_y)_2(Ge_{1-a-b}Zr_aHf_b)_2O_7$,
$A(Tb_{1-x-y}Eu_xLn_y)(Ge_{1-a-b}Zr_aHf_b)O_4$,
$Ba_2(Tb_{1-x-y}Eu_xLn_y)_2(Ge_{1-a-b}Zr_aHf_b)_4O_{13}$,
$Sr_3(Tb_{1-x-y}Eu_xLn_y)_2(Ge_{1-a-b}Zr_aHf_b)_6O_{18}$,
with for each material independently:
Ln=La, Gd, Lu, Y or mixtures thereof,
A=Li, Na, K, Rb, Cs or mixtures thereof,
AE=Sr, Ca, Ba, or mixtures thereof,
x>0 and <1 and y≥0 and <1, wherein 1-x-y>0 and a, b≥0 and <0.2 and z≥0 and ≤1, and the non-matrix material comprises a material with a garnet structure.

2. The light emitting device according to claim 1, wherein the matrix material has a melting point of <1300° C.

3. The light emitting device according to claim 1, wherein the matrix material is red-emitting.

4. The light emitting device according claim 1, wherein the matrix material has a melting point which is >400° C. lower than that of the other light emitting materials.

5. The light emitting device according to claim 1, wherein one of the light emitting materials, which is not the matrix material, is green-emitting or yellow-emitting.

6. The light emitting device according to claim 1, wherein one of the light emitting materials, which is not the matrix material, is blue-emitting.

7. The light emitting device according to claim 1, wherein said phosphor ceramic comprises more than one light emitting material, which is not a matrix material, and there are one or more zones or areas within the phosphor ceramic, in which essentially only selected materials under these "non-matrix" light emitting materials are present.

8. The light emitting device according to claim 1, wherein the volume fraction of the matrix material in the phosphor ceramic (in vol.-%/vol.-% in the finished phosphor ceramic) is between ≥20% and ≤99%.

9. A method of manufacturing a light emitting device according to claim 1, comprising the steps of:
a) providing starting materials comprising at least one light emitting matrix material and at least one further light emitting material in powder form;
b) optionally shaping, in particular by axial and/or cold isostatic pressing and/or tape casting or slot die processes and/or thermoplastic processes;
c) sintering and/or hot pressing of the starting materials into a ceramic;
d) optionally recompressing the sintered ceramic by hot isostatic pressing;
e) optionally reworking the sintered ceramic.

10. A system comprising a light emitting device according to claim 1, the system being used in one or more of the following applications:
Office lighting systems
household application systems
shop lighting systems,
home lighting systems,
accent lighting systems,
spot lighting systems,
theater lighting systems,
fiber-optics application systems,
projection systems,
self-lit display systems,
pixelated display systems,
segmented display systems,
warning sign systems,
medical lighting application systems,
indicator sign systems, and
decorative lighting systems
portable systems
automotive applications
green house lighting systems.

* * * * *